United States Patent [19]
Vale et al.

[11] Patent Number: 5,194,836
[45] Date of Patent: Mar. 16, 1993

[54] THIN FILM, MICROWAVE FREQUENCY MANIFOLDED FILTER BANK

[75] Inventors: Christopher R. Vale, Elk Ridge; Dale E. Dawson; David M. Krafcsik, both of Glen Burnie, all of Md.

[73] Assignee: Westinghouse Electric Corp., Pittsburgh, Pa.

[21] Appl. No.: 750,694

[22] Filed: Aug. 20, 1991

Related U.S. Application Data

[63] Continuation of Ser. No. 499,865, Mar. 26, 1990, abandoned.

[51] Int. Cl.⁵ .................. H03H 9/205; H03H 9/70; H03H 9/56
[52] U.S. Cl. .................. 333/133; 333/191; 310/320; 310/324
[58] Field of Search .................. 333/187–192, 333/133; 310/320, 324

[56] References Cited

U.S. PATENT DOCUMENTS

| | | | |
|---|---|---|---|
| 3,426,300 | 2/1969 | Chun-Ho | 333/192 |
| 3,486,046 | 12/1969 | Zalar | 310/324 |
| 3,602,894 | 8/1971 | Sykes | 333/133 |
| 3,613,031 | 12/1971 | Pond | 333/189 |
| 4,013,982 | 3/1977 | Wood et al. | 333/192 |
| 4,456,850 | 6/1984 | Inoue et al. | 310/324 |
| 4,547,748 | 10/1985 | Ballato | 310/320 X |
| 4,751,419 | 6/1988 | Takahata | 310/324 |

FOREIGN PATENT DOCUMENTS

| | | | |
|---|---|---|---|
| 3038261 | 4/1982 | Fed. Rep. of Germany | 333/187 |
| 156220 | 9/1983 | Japan | 333/191 |
| 72277 | 4/1985 | Japan | 310/324 |
| 144012 | 7/1985 | Japan | 333/191 |
| 149215 | 8/1985 | Japan | 333/187 |
| 88408 | 4/1987 | Japan | 310/324 |
| 94007 | 4/1987 | Japan | 333/187 |

Primary Examiner—Paul M. Dzierzynski
Assistant Examiner—Benny T. Lee
Attorney, Agent, or Firm—D. G. Maire; J. P. Moran

[57] ABSTRACT

A miniature thin film microwave frequency acoustic filter device comprising acoustic resonators formed on the same dielectric membrane so that their frequency responses are identical. Because the filters are miniature, they can be manifolded without manifolding circuitry that normally causes significant filter losses.

5 Claims, 5 Drawing Sheets

THIN FILM, MICROWAVE FREQUENCY MANIFOLDED FILTER BANK

This application is a continuation of application Ser. No. 07/499,865 filed Mar. 26, 1990 now abandoned.

BACKGROUND OF THE INVENTION

The present invention relates to a filter device structure, and more particularly, to a thin film microwave frequency acoustic filter device structure.

Filter banks are used to perform real time spectrum analysis of broad band signals. Typically, filter banks comprise individual filters that are large, expensive and are extremely difficult to manifold, especially at high frequencies. The complicated manifolding circuitry causes significant filter losses. Also, the bandwidth available with current microwave filters is too limited for effective use in filter banks. For example, the bandwidth of 2 GHz microstrip filters cannot be made less than about 8% (160 MHz) without accessive insertion losses (5 DB). Bandwidths of approximately 20 MHz can be achieved with coax filters. But, coax filters are large, cannot be manifolded easily and each pole of a coax filter requires individual adjustment.

SUMMARY OF THE INVENTION

It is an object of the present invention to provide a miniature thin film filter device.

It is another object of the present invention to provide a miniature microwave frequency thin film filter device.

It is a further object of the present invention to provide a miniature microwave frequency thin film acoustic filter device.

It is still a further object of the present invention to provide a manufacturable miniature microwave frequency thin film acoustic filter device.

To achieve the above and other objects, the present provides a thin film, microwave frequency device comprising a substrate having holes formed therein; a dielectric membrane positioned on said substrate and over the holes; and a plurality of resonators respectively formed on a portion of said dielectric membrane over corresponding ones of the holes, said resonators being operatively connected to each other and each resonator comprising—a first electrode formed on said dielectric membrane; a piezoelectric film formed on said first electrode; and a second electrode formed on said piezoelectric film.

DESCRIPTION OF THE PREFERRED EMBODIMENT

Figure 1:
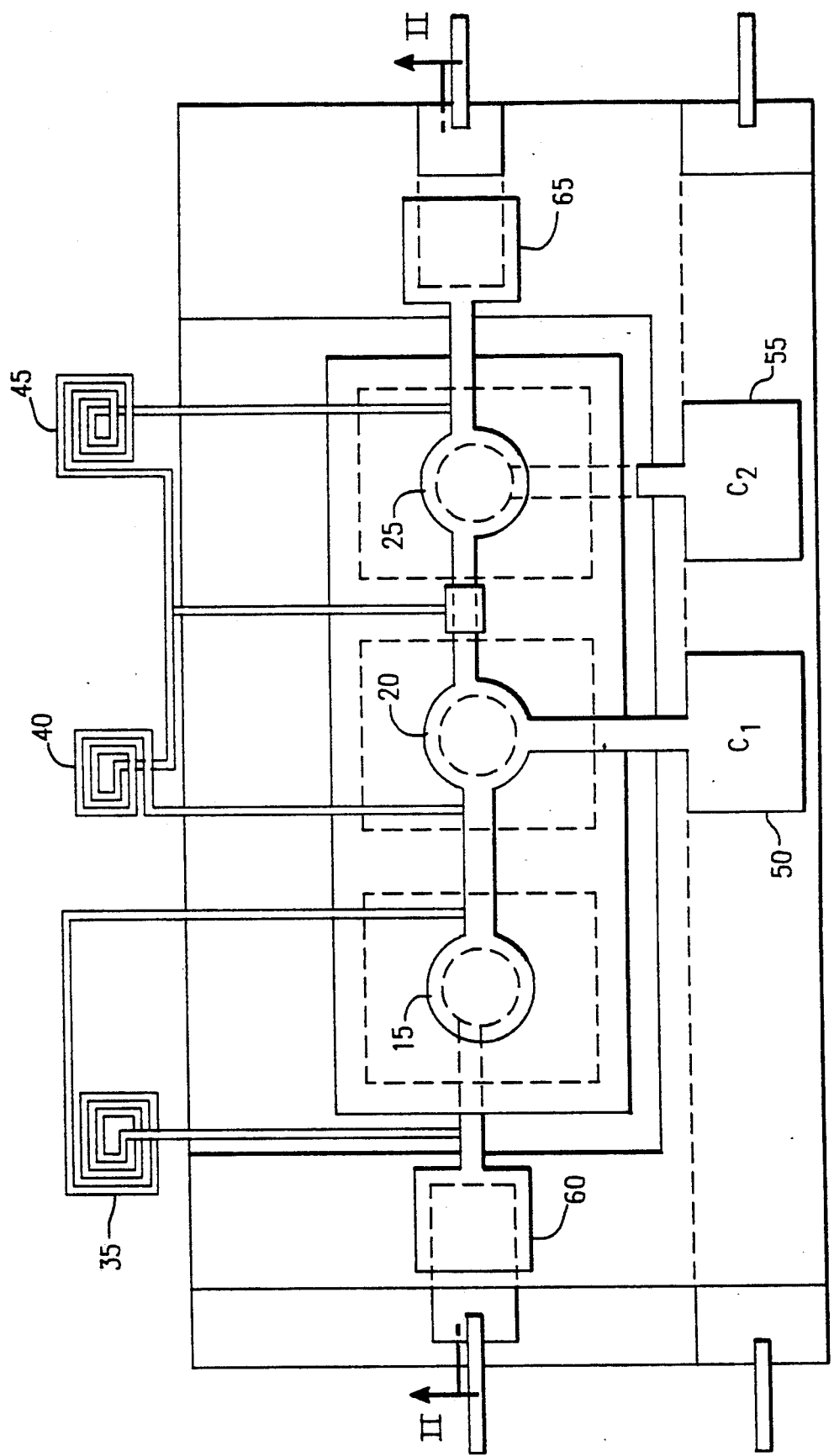
FIG. 1 is a plan view of a three-pole filter device embodying the present invention.

FIG. 1 is a plan view of a three-pole filter device embodying the present invention. In FIG. 1, reference numerals 15, 20 and 25 respectively identify acoustic resonators. Each of the resonators 15, 20 and 25 is formed on a high resistivity dielectric membrane 30 shown in FIG. 2. The acoustic resonators 15, 20 and 25 are respectively connected to compensating inductors 35, 40 and 45. A capacitor 50 having a capacitance C, capacitively couples the resonators 15 and 20 to ground; and a capacitor 55 having a capacitance $C_2$ capacitively couples resonators 20 and 25 to ground. A pair of external capacitors 60 and 65 complete the ladder filter. As shown in FIG. 1 the ladder filter embodying the present invention has a size of approximately 40 mils × 40 mils.

Figure 2:
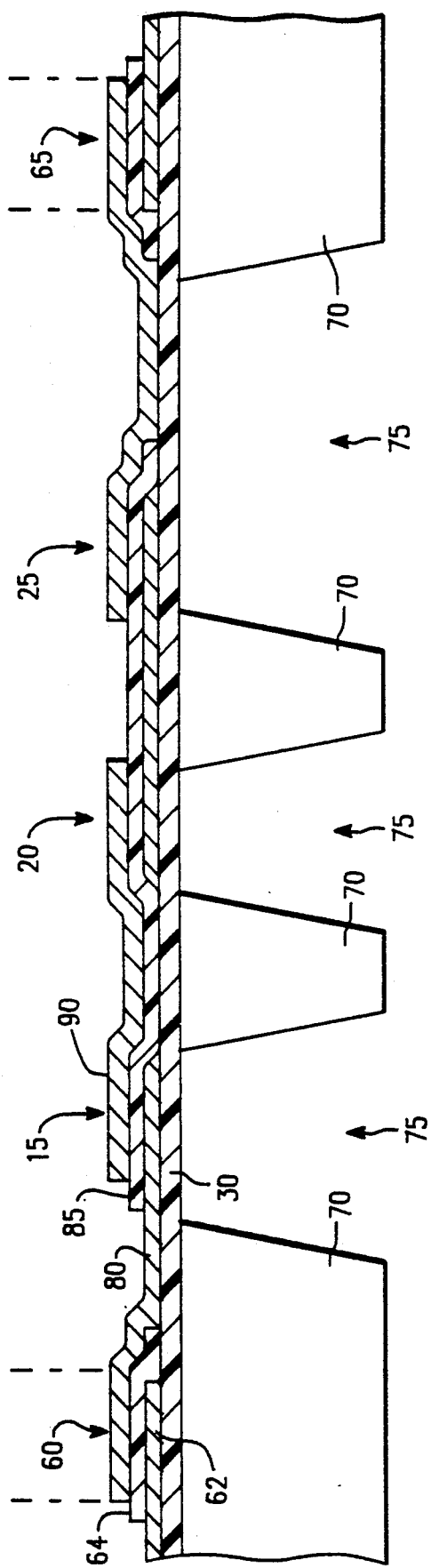
FIG. 2 is a schematic, cross-sectional diagram of the FIG. 1 device along the line 2—2.

FIG. 2 is a schematic, cross-sectional diagram of the FIG. 1 device along the line 2—2 shown in FIG. 1. In FIG. 2, reference numeral 70 identifies a substrate upon which the FIG. 1 device is constructed. The substrate can comprise any high resistivity semiconductor material such as purified silicon or gallium arsenide. The dielectric film 30 comprises, for example, silicon dioxide ($SiO_2$). In a completed structure as shown in FIG. 2, the dielectric membrane 30 serves as a support structure for the resonators 15, 20 and 25. Typically, the dielectric membrane 30 is formed on a substrate 70, and then a portion 75 of the substrate 70 is removed by any common masking/etching technique.

The basic structure of an acoustic resonator in accordance with the present invention, is the same for each of the resonators 15, 20 and 25. Thus, the following discusses only the structure of resonator 15. Referring to FIG. 2, resonator 15 comprises a first or bottom electrode 80, a layer of piezoelectric material 85 formed on the first or bottom electrode 80, and a second or top electrode 90 formed over the layer of piezoelectric material 85. The piezoelectric material can comprise, for example, AlN or ZnO (zinc oxide).

Tables 1-3 in the appendix attached hereto show the characteristics of a 950 MHz resonator in accordance with the present invention in each of the Tables, Fser and Fpar respectively refer to the serial and parallel resonance frequencies; Tc refers to the temperature coefficient of the resonator; Co, Cm, Lm and Rm refer to the measured values of the resonator equivalent circuit elements as schematically illustrated in, for example, FIG. 4; Q refers to the Q of the resonator and FOM indicates a figure of merit corresponding to the ratio of Co/Cm to the Q of the resonator. Referring to Table 1, when layer 30 has a thickness of 0.90506 μm, and the resonator is operated in the fundamental mode, the Q of the resonator is 2270.09. Referring to Table 2, the same quality resonator can be obtained with the layer 30 being more than 3.3 times thicker, when the resonator is operated with the second harmonic. Table 3 shows that when the resonator is operated with the third harmonic, the layer 30 can almost 6 μm and still achieve about the same Q as when operated in the fundamental mode with a much thinner layer 30.

With the structure shown in FIG. 2, quality resonators can be more easily manufactured because the dielectric membrane (layer 30) can be much thicker. By simply operating the resonator at a harmonic, acceptable performance can be obtained with what would be unacceptable device dimensions at the fundamental mode. FIG. 2 also illustrates an input capacitor 60 and an output capacitor 65. The input capacitor 60 comprises a first capacitor electrode 62 and a first capacitor dielectric layer positioned on the first capacitor electrode 62 and underneath the first or bottom electrode 80. As seen in FIG. 2, the structure of the output capacitor 65 is basically the same as that of input capacitor 60.

Figure 3:
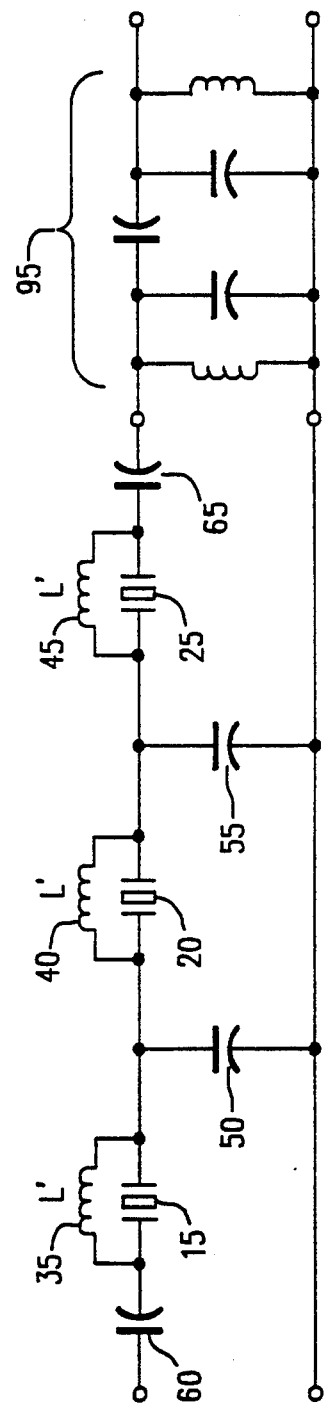
FIG. 3 is a schematic diagram of the FIG. 1 device including a guard filter circuit.

FIG. 3 is a schematic diagram of the FIG. 1 device including a guard filter circuit 95. It should be understood that the capacitors 60 and 65 may not be needed for some three pole filters, that they may be replaced with inductors in some cases, and that the coupling capacitors may also be replaced by coupling inductors for some designs. The essentials are that the filter be a series resonant circuit in series type connection so that the out-of-band input impedance is very high compared to the in-band input impedance. This fact, and the very small size relative to the center frequency wavelength allows the simple and effective manifolding.

Figure 4:
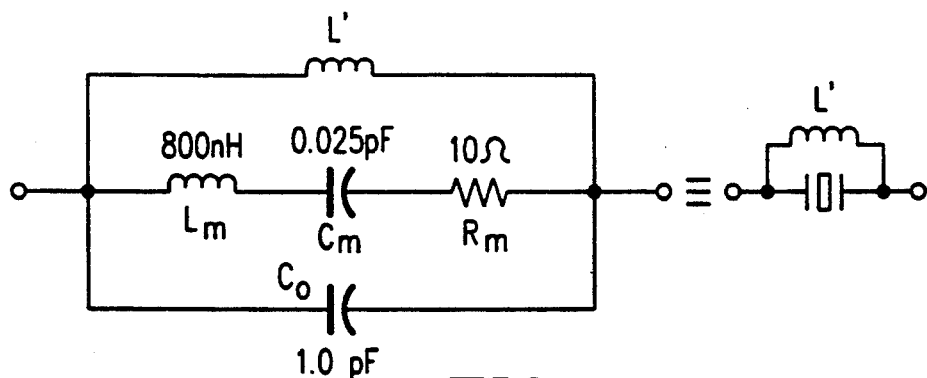
FIG. 4 is a schematic circuit model of a resonator of the present invention together with an associated compensating inductor.
Figure 5A:
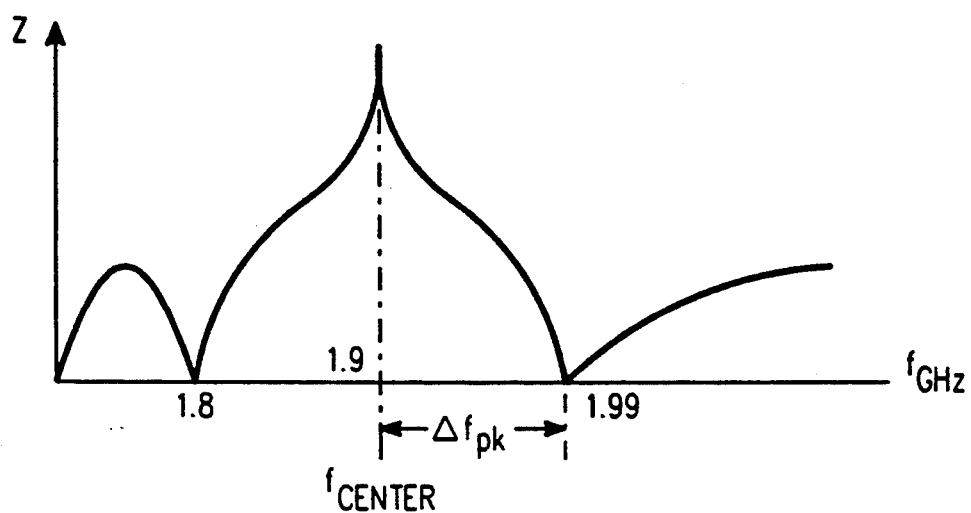
FIGS. 5A and 5B illustrate representative characteristics of the filters embodying the present invention.
Figure 5B:
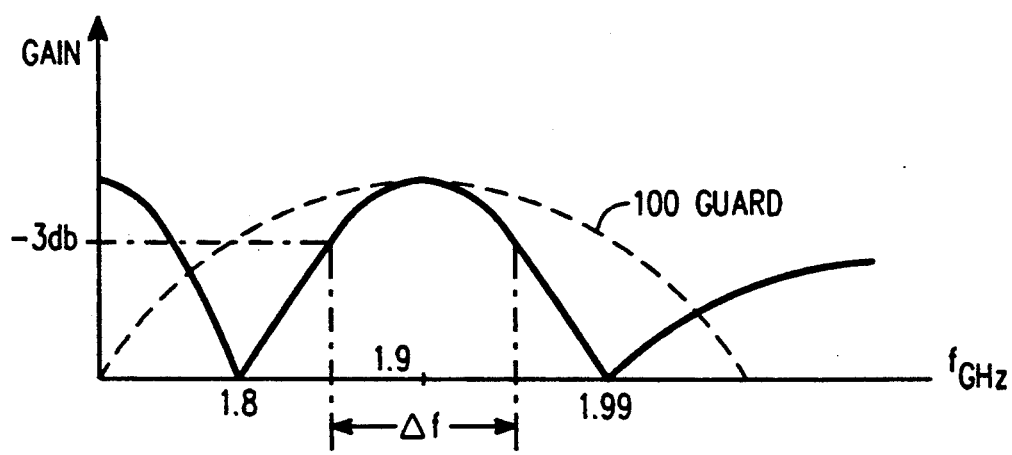

FIG. 4 is a schematic circuit model of the resonators 15, 20 and 25 together with the associated compensating inductor L'. The circuit values for the serial inductance (Lm), capacitance (Cm) and resistance (Rm) and the parallel capacitance (Co) shown in FIG. 4 are for frequency, $f_0$, of approximately 1.1 GHz. The frequency response of the FIG. 1 structure (i.e., FIG. 3 circuit) is shown in FIGS. 5A and 5B. The value of compensating inductor L' is selected in accordance with the following formula:

$$L' = \frac{1}{(2\pi f_{center})^2 C_0}$$

where $f_{center}$ is the center frequency of the resonator. With the structure of the present invention, the attenuation peaks (or gain zeros) shown in FIG. 5B are widely separated and the bandwidth is represented by $\Delta f$. The separation of the attenuation peaks (or gain zeros) is determined by:

$$\Delta f_{pk} = f_0 \sqrt{L'/L_m}$$

where $\Delta f_{pk}$ is the change in frequency between the center frequency and the closest null and the response of the resonator. In FIG. 5B, the filter characteristic identified by reference numeral 100 corresponds to that of the guard filter 95 The guard filter 95, rejects the DC response of the FIG. 3 circuit. In some applications, other circuitry already in existence, or designed for another function (a transformer, for example) will obviate the need for a guard filter. Basically, the spacing $\Delta f_{pk}$ of the impedance poles and zeros shown in FIG. 5A limits the wideband capability of the FIG. 3 circuit. The inventors of the subject application have developed a wideband filter device that has, in a preferred embodiment, a 10 MHz passband and can be used in, for example, a 100 MHz filter bank. The filter bank comprises eleven, 10 MHz wide filters and the filter bank spans 1.9 to 2.0 GHz.

Figure 6:
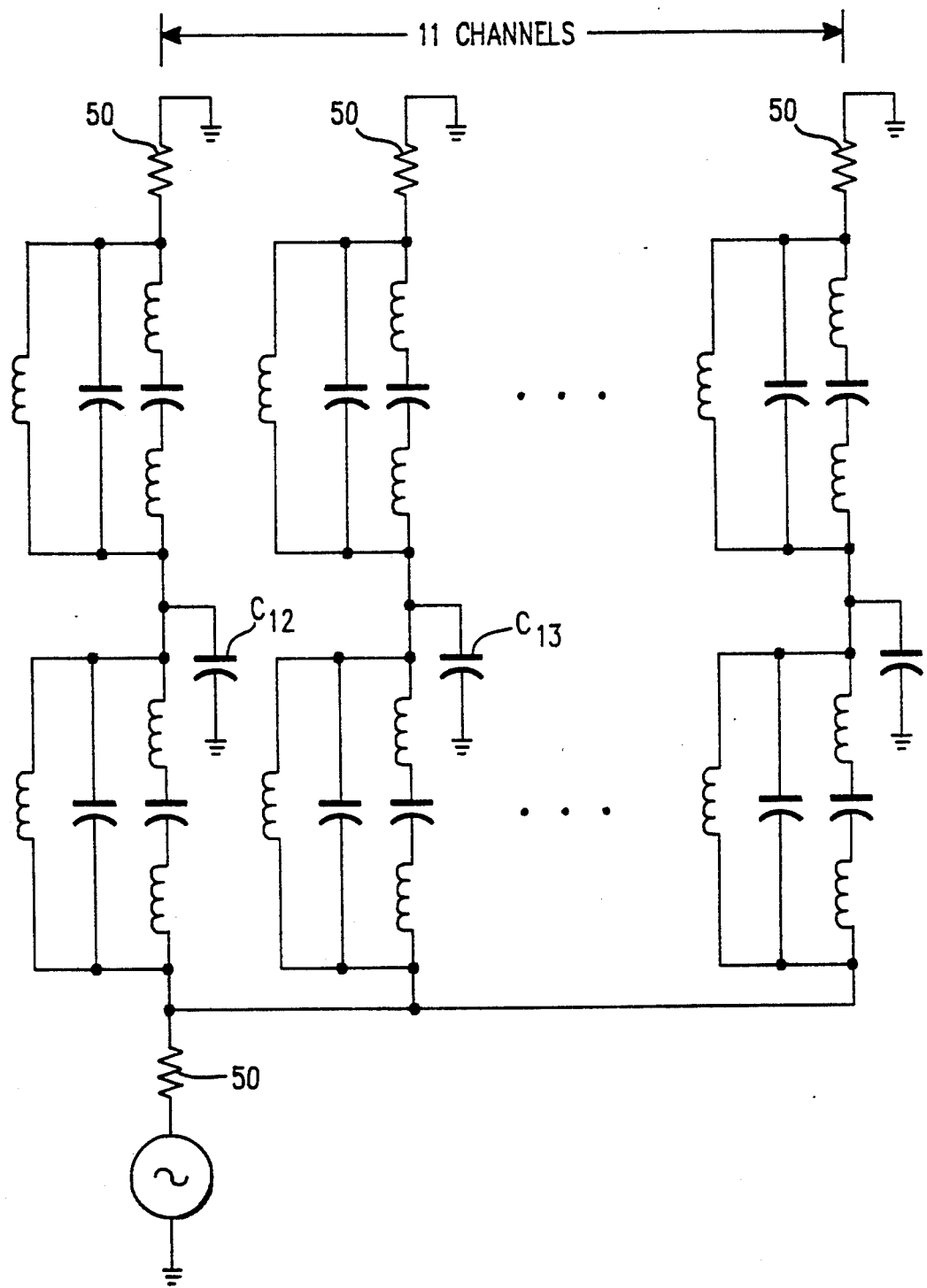
FIG. 6 is partial schematic diagram of a manifolded filter bank.
Figure 7:
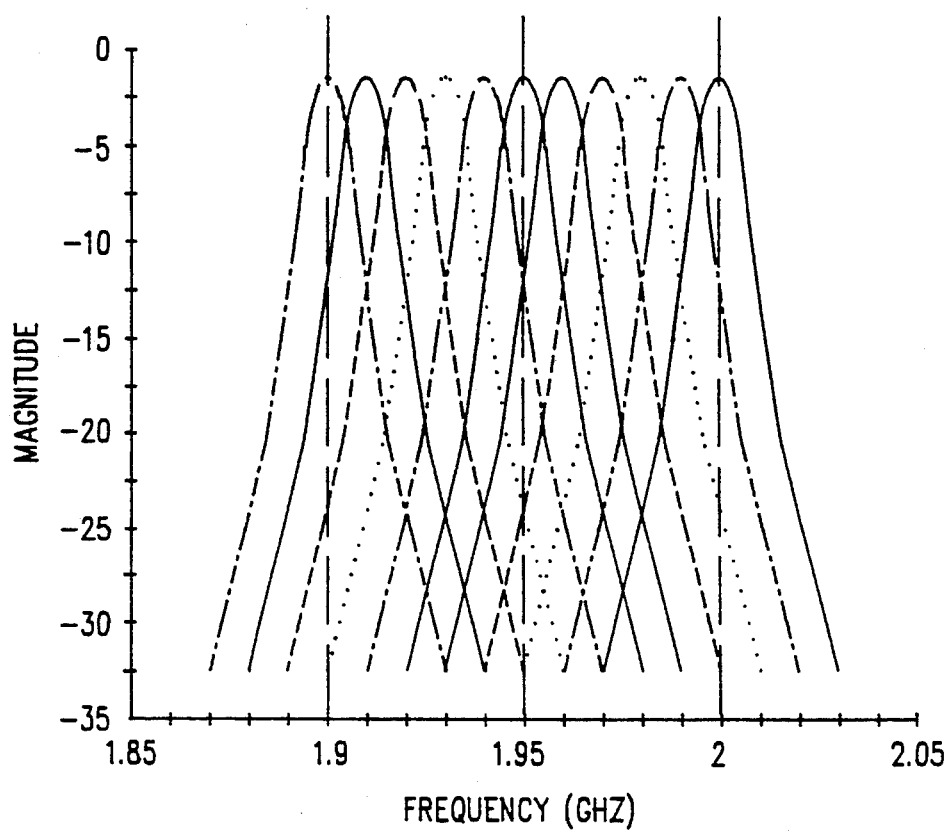
FIG. 7 illustrates the frequency response of the FIG. 6 filter bank.
Figure 8:
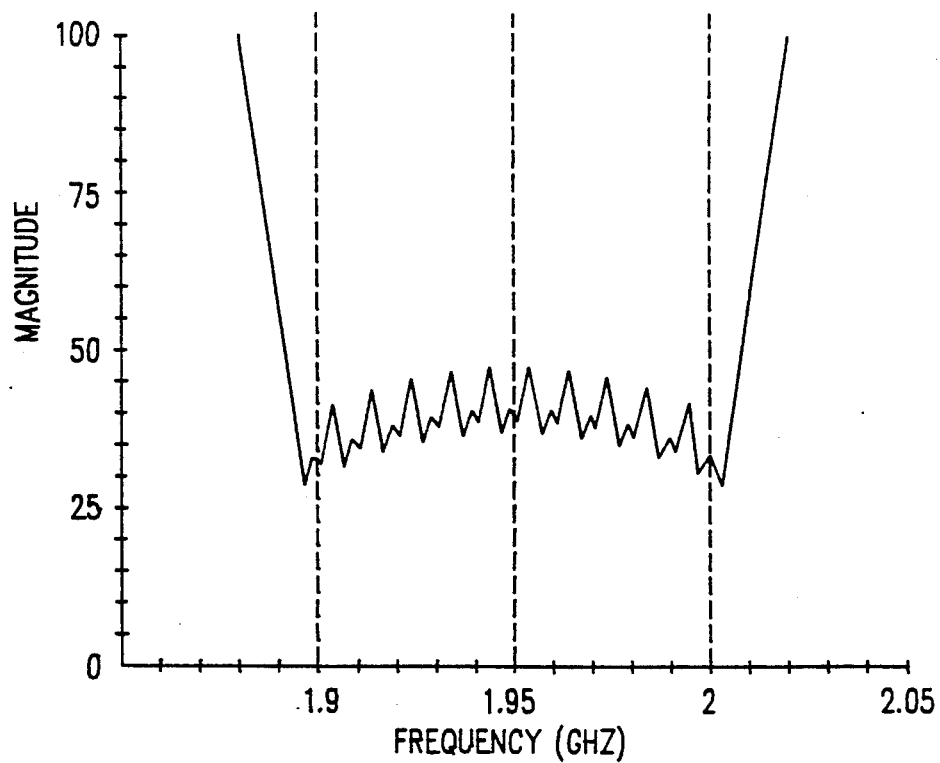
FIG. 8 illustrates the input impedance of the FIG. 6 filter bank.

FIG. 6 is partial schematic diagram of the eleven channel manifolded filter banks. FIGS. 5A and 5B illustrate representative characteristics of the individual filters. The eleven filters were designed in accordance with similar principle to the FIG. 3 circuit and the known complimentary filter theory such as described in Matthaei, Young and Jones, *Filter Handbook*, Artech House, 1964, reprinted 1982. Filters with 3 dB crossovers and high stop band impedances can be combined in parallel without adjacent band distortion or input variation with frequency. Because the filters of the present invention are small (e.g., 0.040"×0.040"), they can be connected at a single point without elaborate manifolded circuitry. In FIG. 6 $C_{12}$ and $C_{13}$ represent coupling capacitance between cascaded resonators, and 52 represents a load resistor of typically 50 ohms. Thus, spurious responses and passband distortion normally associated with manifolding circuitry is eliminated with the present invention. Also, the electrically small size of the resonators in accordance with the present invention permit the resonators to be connected so that their 3 dB points overlap and so that the circuit has a 50 ohm input impedance over the entire frequency band of operation of the filter bank with no spurious responses. FIG. 7 illustrates the frequency response of the eleven manifolded filters shown in FIG. 6; and FIG. 8 illustrates the input impedance of the manifolded filters. As shown in FIG. 8, the input impedance is slightly less than 50 ohms over the 100 MHz bandwidth of the FIG. 6 filter bank.

With the present invention, resonators can be combined on a single dielectric membrane and connected to form high quality, high frequency filter banks without the need for bulky and complicated manifolding circuitry previously required with high frequency filters (e.g., above 1 GHz).

It will be recognized by those skilled in the art that the present invention is not limited to the above-described embodiment which has been provided merely as an example of the present invention. Instead, the present invention is defined by the appended claims.

TABLE 1

| Thickness Layer 85 (μm) | Thickness Layer 30 (μm) | Fser (MHz) | Fpar (MHz) | Tc (ppm/C) | Fundamental Co (pf) | Cm (ff) | Lm (uh) | Rm (ohms) | Q | Co/Cm | FOM |
|---|---|---|---|---|---|---|---|---|---|---|---|
| 0.1 | 2.12920 | 950.002 | | 74.124 | 6.6928 | | | 118.72 | | | 0.2108 |
| 0.2 | 2.05397 | 949.999 | 950.151 | 73.601 | 3.3464 | 1.0676 | 26.2892 | 70.67 | 2220.54 | 3134.48 | 0.7084 |
| 0.3 | 1.99057 | 950.000 | 950.314 | 72.751 | 2.2309 | 1.4790 | 18.9764 | 47.99 | 2360.48 | 1508.37 | 1.5649 |
| 0.4 | 1.93577 | 949.999 | 950.541 | 71.569 | 1.6732 | 1.9095 | 14.6988 | 35.25 | 2489.22 | 876.28 | 2.8407 |
| 0.5 | 1.88725 | 950.000 | 950.837 | 70.048 | 1.3386 | 2.3591 | 11.8974 | 27.24 | 2606.83 | 567.41 | 4.5942 |
| 0.6 | 1.84332 | 949.999 | 951.203 | 68.168 | 1.1155 | 2.8317 | 9.9118 | 21.80 | 2713.77 | 393.93 | 6.8891 |
| 0.7 | 1.80268 | 950.000 | 951.654 | 65.902 | 0.9561 | 3.3335 | 8.4197 | 17.88 | 2810.31 | 286.82 | 9.7981 |
| 0.8 | 1.76432 | 950.002 | 952.198 | 63.210 | 0.8366 | 3.8725 | 7.2478 | 14.94 | 2896.39 | 216.04 | 13.4068 |
| 0.9 | 1.72741 | 950.001 | 952.844 | 60.037 | 0.7436 | 4.4583 | 6.2954 | 12.65 | 2971.56 | 166.80 | 17.8150 |
| 1.0 | 1.69121 | 949.998 | 953.613 | 56.317 | 0.6693 | 5.1022 | 5.5009 | 10.82 | 3034.88 | 131.17 | 23.1362 |
| 1.1 | 1.65502 | 950.001 | 954.531 | 51.967 | 0.6084 | 5.8175 | 4.8246 | 9.34 | 3084.82 | 104.59 | 29.4949 |
| 1.2 | 1.61817 | 950.001 | 955.621 | 46.890 | 0.5577 | 6.6188 | 4.2404 | 8.11 | 3119.29 | 84.26 | 37.0177 |
| 1.3 | 1.57992 | 950.002 | 956.918 | 40.978 | 0.5148 | 7.5229 | 3.7308 | 7.10 | 3135.54 | 68.44 | 45.8178 |
| 1.4 | 1.53944 | 950.001 | 958.456 | 34.116 | 0.4781 | 8.5472 | 3.2837 | 6.26 | 3130.39 | 55.93 | 55.9681 |
| 1.5 | 1.49571 | 950.002 | 960.282 | 26.198 | 0.4462 | 9.7085 | 2.8910 | 5.57 | 3100.40 | 45.96 | 67.4609 |

TABLE 1-continued

Fundamental

| Thickness Layer 85 (μm) | Thickness Layer 30 (μm) | Fser (MHz) | Fpar (MHz) | Tc (ppm/C) | Co (pf) | Cm (ff) | Lm (uh) | Rm (ohms) | Q | Co/Cm | FOM |
|---|---|---|---|---|---|---|---|---|---|---|---|
| 1.6 | 1.44746 | 950.001 | 952.443 | 17.154 | 0.4183 | 11.0192 | 2.5471 | 5.00 | 3042.65 | 37.96 | 80.1519 |
| 1.7 | 1.39300 | 950.000 | 964.941 | 6.987 | 0.3937 | 12.4810 | 2.2488 | 4.54 | 2955.63 | 31.54 | 93.6999 |
| 1.8 | 1.33003 | 949.999 | 967.810 | −4.162 | 0.3718 | 14.0733 | 1.9943 | 4.19 | 2840.66 | 26.42 | 107.5180 |
| 1.9 | 1.25532 | 950.001 | 970.992 | −15.948 | 0.3523 | 15.7382 | 1.7834 | 3.94 | 2703.15 | 22.38 | 120.7730 |
| 2.0 | 1.16431 | 950.001 | 974.335 | −27.761 | 0.3346 | 17.3628 | 1.6165 | 3.78 | 2553.20 | 19.27 | 132.4730 |
| 2.1 | 1.05050 | 950.001 | 977.586 | −38.738 | 0.3187 | 18.7773 | 1.4947 | 3.71 | 2404.29 | 16.97 | 141.6550 |
| 2.2 | 0.90506 | 950.001 | 980.405 | −47.895 | 0.3042 | 18.7847 | 1.4186 | 3.73 | 2270.09 | 15.38 | 147.6340 |
| 2.3 | 0.71767 | 950.000 | 982.476 | −54.420 | 0.2910 | 20.2355 | 1.3870 | 3.83 | 2160.30 | 14.38 | 150.2270 |
| 2.4 | 0.48136 | 950.000 | 983.657 | −58.051 | 0.2789 | 20.1095 | 1.3957 | 4.01 | 2077.81 | 13.87 | 149.8340 |
| 2.5 | 0.20386 | 950.000 | 984.061 | −59.326 | 0.2677 | 19.5410 | 1.4363 | 4.25 | 2018.81 | 13.70 | 147.3580 |

TABLE 2

2nd Harmonic

| Thickness Layer 85 (μm) | Thickness Layer 30 (μm) | Fser (MHz) | Fpar (MHz) | Tc (ppm/C) | Co (pf) | Cm (ff) | Lm (uh) | Rm (ohms) | Q | Co/Cm | FOM |
|---|---|---|---|---|---|---|---|---|---|---|---|
| 0.2 | 5.19765 | 950.000 | 950.067 | 74.571 | 3.3464 | 0.4748 | 59.1144 | 127.31 | 2771.54 | 1048.22 | 0.3932 |
| 0.3 | 5.13425 | 950.001 | 950.137 | 74.173 | 2.2309 | 0.6452 | 43.4988 | 90.26 | 2876.76 | 3457.56 | 0.8320 |
| 0.4 | 5.07945 | 950.000 | 950.233 | 73.684 | 1.6732 | 0.8189 | 34.2743 | 68.94 | 2967.70 | 2043.26 | 1.4524 |
| 0.5 | 5.03093 | 950.001 | 950.354 | 73.063 | 1.3386 | 0.9966 | 28.1622 | 55.18 | 3046.25 | 1343.11 | 2.2680 |
| 0.6 | 4.98700 | 950.000 | 950.503 | 72.304 | 1.1155 | 1.1807 | 23.7712 | 45.56 | 3114.44 | 944.75 | 3.2966 |
| 0.7 | 4.94636 | 950.001 | 950.682 | 71.397 | 0.9561 | 1.3745 | 20.4200 | 38.41 | 3173.74 | 695.63 | 4.5624 |
| 0.8 | 4.90801 | 950.000 | 950.897 | 70.322 | 0.8366 | 1.5819 | 17.7427 | 32.84 | 3225.39 | 528.86 | 6.0987 |
| 0.9 | 4.87110 | 949.999 | 951.153 | 69.055 | 0.7436 | 1.8078 | 15.5257 | 28.34 | 3270.10 | 411.36 | 7.9495 |
| 1.0 | 4.83489 | 950.000 | 951.459 | 67.560 | 0.6693 | 2.0579 | 13.6388 | 24.61 | 3308.26 | 325.23 | 10.1720 |
| 1.1 | 4.79871 | 949.999 | 951.824 | 65.791 | 0.6084 | 2.3392 | 11.9987 | 21.44 | 3339.80 | 260.11 | 12.8400 |
| 1.2 | 4.76186 | 949.999 | 952.262 | 63.688 | 0.5577 | 2.6603 | 10.5504 | 18.72 | 3364.27 | 209.65 | 16.0468 |
| 1.3 | 4.72361 | 950.000 | 952.793 | 61.172 | 0.5148 | 3.0319 | 9.2571 | 16.34 | 3380.63 | 169.80 | 19.9091 |
| 1.4 | 4.68313 | 949.999 | 953.439 | 58.141 | 0.4781 | 3.4677 | 8.0939 | 14.26 | 3387.25 | 137.86 | 24.5699 |
| 1.5 | 4.63940 | 950.000 | 954.232 | 54.465 | 0.4462 | 3.9845 | 7.0440 | 12.43 | 3381.66 | 111.98 | 30.1988 |
| 1.6 | 4.59115 | 949.999 | 955.213 | 49.982 | 0.4183 | 4.6039 | 6.0964 | 10.83 | 3360.49 | 90.86 | 36.9859 |
| 1.7 | 4.53668 | 950.001 | 956.436 | 44.497 | 0.3937 | 5.3518 | 5.2443 | 9.43 | 3319.31 | 73.56 | 45.1223 |
| 1.8 | 4.47371 | 950.000 | 957.962 | 37.799 | 0.3718 | 6.2584 | 4.4847 | 8.23 | 3252.93 | 59.41 | 54.7523 |
| 1.9 | 4.39901 | 950.000 | 959.864 | 29.701 | 0.3523 | 7.3535 | 3.8168 | 7.22 | 3156.17 | 47.90 | 65.8867 |
| 2.0 | 4.30800 | 950.000 | 962.207 | 20.133 | 0.3346 | 8.6551 | 3.2428 | 6.40 | 3025.89 | 38.66 | 78.2607 |
| 2.1 | 4.19419 | 950.000 | 964.998 | 9.316 | 0.3187 | 10.1427 | 2.7672 | 5.77 | 2864.49 | 31.42 | 91.1612 |
| 2.2 | 4.04874 | 950.001 | 968.114 | −2.013 | 0.3042 | 11.7115 | 2.3965 | 5.33 | 2683.98 | 25.98 | 103.3250 |
| 2.3 | 3.86135 | 950.000 | 971.192 | −12.458 | 0.2910 | 13.1270 | 2.1381 | 5.09 | 2506.97 | 22.17 | 113.0920 |
| 2.4 | 3.62505 | 950.000 | 973.647 | −20.204 | 0.2789 | 14.0559 | 1.9968 | 5.05 | 2359.82 | 19.84 | 118.9430 |
| 2.5 | 3.34754 | 950.000 | 974.942 | −23.788 | 0.2677 | 14.2416 | 1.9708 | 5.21 | 2559.49 | 18.80 | 120.1990 |
| 2.6 | 3.05932 | 950.005 | 974.928 | −22.958 | 0.2574 | 13.6830 | 2.0512 | 5.55 | 2206.95 | 18.81 | 117.3110 |
| 2.7 | 2.79865 | 950.002 | 973.850 | −18.696 | 0.2479 | 12.6011 | 2.2273 | 6.06 | 2192.65 | 19.67 | 111.4640 |
| 2.8 | 2.58552 | 950.000 | 972.123 | −12.470 | 0.2390 | 11.2621 | 2.4922 | 6.75 | 2205.32 | 21.22 | 103.9060 |
| 2.9 | 2.41917 | 950.000 | 970.094 | −5.561 | 0.2308 | 9.8662 | 2.8447 | 7.59 | 2236.23 | 23.39 | 95.5996 |
| 3.0 | 2.29010 | 949.999 | 967.997 | 1.170 | 0.2231 | 8.5330 | 3.2892 | 8.61 | 2279.28 | 26.14 | 87.1792 |
| 3.1 | 2.18840 | 950.000 | 965.973 | 7.241 | 0.2159 | 7.3213 | 3.8336 | 9.82 | 2330.25 | 29.49 | 79.0208 |
| 3.2 | 2.10636 | 949.999 | 964.094 | 12.429 | 0.2092 | 6.2521 | 4.4892 | 11.23 | 2386.17 | 33.45 | 71.3296 |
| 3.3 | 2.03845 | 950.001 | 962.392 | 16.667 | 0.2028 | 5.3255 | 5.2703 | 12.87 | 2444.90 | 38.08 | 64.1986 |
| 3.4 | 1.98092 | 950.000 | 960.871 | 19.966 | 0.1968 | 4.5309 | 6.1945 | 14.76 | 2504.84 | 43.45 | 57.6553 |
| 3.5 | 1.93074 | 949.999 | 959.524 | 22.379 | 0.1912 | 3.8535 | 7.2834 | 16.95 | 2564.80 | 49.62 | 51.6859 |
| 3.6 | 1.88625 | 949.999 | 958.336 | 23.966 | 0.1859 | 3.2774 | 8.5637 | 19.48 | 2623.86 | 56.72 | 46.2558 |
| 3.7 | 1.84591 | 950.000 | 957.292 | 24.783 | 0.1809 | 2.7786 | 10.0684 | 22.41 | 2681.26 | 64.89 | 41.3205 |
| 3.8 | 1.80863 | 950.001 | 956.373 | 24.880 | 0.1761 | 2.3707 | 11.8388 | 25.82 | 2736.36 | 74.29 | 36.8326 |
| 3.9 | 1.77356 | 949.999 | 955.561 | 24.290 | 0.1716 | 2.0152 | 13.9277 | 29.81 | 2788.59 | 85.16 | 32.7457 |
| 4.0 | 1.73998 | 950.000 | 954.845 | 23.036 | 0.1673 | 1.7109 | 16.4044 | 34.51 | 2837.49 | 97.79 | 29.0148 |
| 4.1 | 1.70730 | 949.999 | 954.209 | 21.139 | 0.1632 | 1.4501 | 19.3551 | 40.09 | 2881.96 | 112.57 | 25.6013 |
| 4.2 | 1.67496 | 950.000 | 953.646 | 18.591 | 0.1594 | 1.2255 | 22.9029 | 46.79 | 2921.77 | 130.03 | 22.4693 |
| 4.3 | 1.64245 | 949.999 | 953.141 | 15.394 | 0.1556 | 1.0315 | 27.2093 | 54.94 | 2955.95 | 150.89 | 19.5899 |
| 4.4 | 1.60922 | 949.999 | 952.692 | 11.541 | 0.1521 | 0.8635 | 32.5020 | 65.02 | 2983.57 | 176.15 | 16.9380 |
| 4.5 | 1.57470 | 949.999 | 952.289 | 7.029 | 0.1487 | 0.7178 | 39.1034 | 77.71 | 3003.60 | 207.21 | 14.4953 |
| 4.6 | 1.53822 | 949.999 | 951.926 | 1.864 | 0.1455 | 0.5911 | 47.4853 | 94.01 | 3014.97 | 246.16 | 12.2481 |
| 4.7 | 1.49897 | 950.001 | 951.604 | −3.929 | 0.1424 | 0.4810 | 58.3556 | 115.47 | 3016.57 | 296.07 | 10.1886 |
| 4.8 | 1.45596 | 950.000 | 951.313 | −10.291 | 0.1394 | 0.3855 | 72.8050 | 144.50 | 3007.50 | 361.69 | 8.3152 |
| 4.9 | 1.40787 | 950.001 | 951.055 | −17.122 | 0.1366 | 0.3032 | 92.5795 | 184.99 | 2987.18 | 450.54 | 6.6302 |
| 5.0 | 1.35295 | 950.000 | 950.826 | −24.259 | 0.1339 | 0.2328 | 120.5670 | 243.49 | 2955.59 | 575.01 | 5.1401 |
| 5.1 | 1.28876 | 950.000 | 950.628 | −31.472 | 0.1312 | 0.1735 | 161.7690 | 331.41 | 2913.60 | 756.38 | 3.8520 |
| 5.2 | 1.21188 | 950.000 | 950.460 | −38.458 | 0.1287 | 0.1246 | 225.2490 | 469.61 | 2863.04 | 1032.94 | 2.7718 |
| 5.3 | 1.11743 | 950.001 | 950.322 | −44.861 | 0.1263 | 0.0855 | 328.3990 | 698.38 | 2806.82 | 1477.55 | 1.8996 |
| 5.4 | 0.99855 | 950.000 | 950.212 | −50.306 | 0.1239 | 0.0554 | 506.7800 | 1100.72 | 2748.18 | 2237.90 | 1.2280 |
| 5.5 | 0.84610 | 950.000 | 950.130 | −54.476 | 0.1217 | 0.0334 | 839.6960 | 1862.04 | 2691.76 | 3640.62 | 0.7394 |
| 5.6 | 0.65010 | 950.000 | 950.073 | −57.202 | 0.1195 | 0.0184 | 1522.5600 | 3440.20 | 2641.80 | 6483.39 | 0.4075 |
| 5.7 | 0.40579 | 950.000 | 950.036 | −58.567 | 0.1174 | 0.0090 | 3105.4800 | 7126.77 | 2600.90 | 12991.50 | 0.2002 |
| 5.8 | 0.12529 | 950.000 | 950.015 | −58.959 | 0.1154 | 0.0038 | 7459.5200 | 12316.90 | 2571.30 | 30669.00 | 0.0838 |

TABLE 3

3rd Harmonic

| Thickness Layer 85 (μm) | Thickness Layer 30 (μm) | Fser (MHz) | Fpar (MHz) | Tc (ppm/C) | Co (pf) | Cm (ff) | Lm (uh) | Rm (ohms) | Q | Co/Cm | FOM |
|---|---|---|---|---|---|---|---|---|---|---|---|
| 0.2 | 8.34134 | 950.000 | 950.043 | 74.797 | 3.3464 | 0.3052 | 91.9532 | 183.96 | 2983.68 | 10963.00 | 0.2721 |
| 0.3 | 8.27794 | 950.000 | 950.088 | 74.571 | 2.2309 | 0.4126 | 68.0260 | 132.53 | 3063.94 | 5407.17 | 0.5666 |
| 0.4 | 8.22314 | 950.000 | 950.148 | 74.263 | 1.6732 | 0.5212 | 53.8508 | 102.63 | 3132.10 | 3210.31 | 0.9756 |
| 0.5 | 8.17462 | 950.000 | 950.224 | 73.873 | 1.3386 | 0.6316 | 44.4392 | 83.12 | 3191.14 | 2119.40 | 1.5057 |
| 0.6 | 8.13069 | 949.999 | 950.317 | 73.397 | 1.1155 | 0.7459 | 37.6302 | 69.32 | 3240.41 | 1495.55 | 2.1667 |
| 0.7 | 8.09005 | 950.000 | 950.430 | 72.830 | 0.9561 | 0.8657 | 32.4203 | 58.93 | 3284.01 | 1104.42 | 2.9735 |
| 0.8 | 8.05169 | 950.000 | 950.564 | 72.159 | 0.8366 | 0.9940 | 28.2372 | 50.73 | 3322.20 | 841.67 | 3.9471 |
| 0.9 | 8.01478 | 950.000 | 950.724 | 71.367 | 0.7436 | 1.1338 | 24.7552 | 44.03 | 3355.78 | 655.91 | 5.1162 |
| 1.0 | 7.97859 | 949.998 | 950.913 | 70.432 | 0.6693 | 1.2889 | 21.7763 | 38.40 | 3385.21 | 519.28 | 6.5191 |
| 1.1 | 7.94239 | 950.000 | 951.142 | 69.322 | 0.6084 | 1.4639 | 19.1725 | 33.55 | 3410.72 | 415.63 | 8.2062 |
| 1.2 | 7.90554 | 950.000 | 951.417 | 67.996 | 0.5577 | 1.6647 | 16.8604 | 29.32 | 3432.10 | 335.04 | 10.2437 |
| 1.3 | 7.86729 | 950.000 | 951.750 | 66.399 | 0.5148 | 1.8985 | 14.7840 | 25.59 | 3448.85 | 271.19 | 12.7177 |
| 1.4 | 7.82681 | 950.000 | 952.158 | 64.456 | 0.4781 | 2.1748 | 12.9057 | 22.26 | 3459.95 | 219.82 | 15.7399 |
| 1.5 | 7.78308 | 950.000 | 952.664 | 62.068 | 0.4462 | 2.5059 | 11.2001 | 19.30 | 3463.76 | 178.05 | 19.4536 |
| 1.6 | 7.73483 | 950.000 | 953.297 | 59.106 | 0.4183 | 2.9082 | 9.6509 | 16.66 | 3457.71 | 143.83 | 24.0395 |
| 1.7 | 7.68037 | 950.000 | 954.096 | 55.398 | 0.3937 | 3.4028 | 8.2481 | 14.32 | 3438.07 | 115.70 | 29.7162 |
| 1.8 | 7.61739 | 950.000 | 955.118 | 50.730 | 0.3718 | 4.0169 | 6.9871 | 12.27 | 3399.66 | 92.56 | 36.7278 |
| 1.9 | 7.54269 | 950.000 | 956.429 | 44.856 | 0.3523 | 4.7836 | 5.8674 | 10.50 | 3335.82 | 73.64 | 45.3000 |
| 2.0 | 7.45169 | 949.999 | 958.108 | 37.550 | 0.3346 | 5.7373 | 4.8920 | 9.01 | 3239.14 | 58.33 | 55.5343 |
| 2.1 | 7.33787 | 950.000 | 960.229 | 28.739 | 0.3187 | 6.9000 | 4.0677 | 7.82 | 3104.18 | 46.19 | 67.2056 |
| 2.2 | 7.19243 | 950.000 | 962.784 | 18.776 | 0.3042 | 8.2429 | 3.4050 | 6.93 | 2933.09 | 36.91 | 79.4731 |
| 2.3 | 7.00504 | 950.000 | 965.577 | 8.782 | 0.2910 | 9.6209 | 2.9173 | 6.35 | 2742.64 | 30.25 | 90.6779 |
| 2.4 | 6.76873 | 950.000 | 968.089 | 0.752 | 0.2789 | 10.7206 | 2.6180 | 6.09 | 2565.13 | 26.01 | 98.6129 |
| 2.5 | 6.49123 | 950.000 | 969.606 | −3.134 | 0.2677 | 11.1644 | 2.5140 | 6.17 | 2433.72 | 23.98 | 101.4930 |
| 2.6 | 6.20307 | 950.000 | 969.705 | −1.907 | 0.2574 | 10.7897 | 2.6013 | 6.57 | 2361.97 | 23.86 | 99.0027 |
| 2.7 | 5.94236 | 950.000 | 968.549 | 3.499 | 0.2479 | 9.7743 | 2.8715 | 7.32 | 2341.91 | 25.36 | 92.3440 |
| 2.8 | 5.72921 | 950.000 | 966.644 | 11.085 | 0.2390 | 8.4491 | 3.3219 | 8.41 | 2357.73 | 28.29 | 83.3394 |
| 2.9 | 5.56286 | 950.000 | 964.478 | 19.048 | 0.2308 | 7.0883 | 3.9596 | 9.87 | 2395.66 | 32.56 | 73.5793 |
| 3.0 | 5.43378 | 950.000 | 962.368 | 26.322 | 0.2231 | 5.8466 | 4.8005 | 11.71 | 2446.06 | 38.16 | 64.1042 |
| 3.1 | 5.33208 | 950.000 | 960.468 | 32.477 | 0.2159 | 4.7840 | 5.8668 | 13.99 | 2502.54 | 45.13 | 55.4532 |
| 3.2 | 5.25004 | 950.000 | 958.830 | 37.453 | 0.2092 | 3.9059 | 7.1858 | 16.75 | 2560.96 | 53.55 | 47.8259 |
| 3.3 | 5.18214 | 950.000 | 957.449 | 41.362 | 0.2028 | 3.1932 | 8.7896 | 20.03 | 2618.69 | 63.51 | 41.2301 |
| 3.4 | 5.12450 | 950.001 | 956.300 | 44.322 | 0.1968 | 2.6192 | 10.7158 | 23.92 | 2674.15 | 75.16 | 35.5815 |
| 3.5 | 5.07442 | 950.000 | 955.345 | 46.506 | 0.1912 | 2.1576 | 13.0084 | 28.48 | 2726.47 | 88.63 | 30.7630 |
| 3.6 | 5.02993 | 950.000 | 954.551 | 48.027 | 0.1859 | 1.7855 | 15.7196 | 33.81 | 2775.21 | 104.13 | 26.6528 |
| 3.7 | 4.98960 | 949.999 | 953.888 | 48.978 | 0.1809 | 1.4841 | 18.9115 | 40.03 | 2820.20 | 121.88 | 23.1388 |
| 3.8 | 4.95232 | 949.999 | 953.334 | 49.428 | 0.1761 | 1.2386 | 22.6598 | 47.27 | 2861.42 | 142.20 | 20.1231 |
| 3.9 | 4.91724 | 950.000 | 952.867 | 49.424 | 0.1716 | 1.0373 | 27.0566 | 55.71 | 2898.91 | 165.43 | 17.5231 |
| 4.0 | 4.88366 | 950.000 | 952.470 | 48.991 | 0.1673 | 0.8712 | 32.2164 | 65.57 | 2932.72 | 192.06 | 15.2699 |
| 4.1 | 4.85098 | 950.000 | 952.131 | 48.199 | 0.1632 | 0.7331 | 38.2834 | 77.13 | 2962.86 | 222.66 | 13.3067 |
| 4.2 | 4.81864 | 950.000 | 951.840 | 46.861 | 0.1594 | 0.6176 | 45.4429 | 90.74 | 2989.29 | 258.01 | 11.5851 |
| 4.3 | 4.78613 | 950.000 | 951.587 | 45.134 | 0.1556 | 0.5204 | 53.9358 | 106.89 | 3011.88 | 299.11 | 10.0696 |
| 4.4 | 4.75290 | 950.000 | 951.367 | 42.920 | 0.1521 | 0.4380 | 64.0848 | 126.23 | 3030.38 | 347.31 | 8.7253 |
| 4.5 | 4.71838 | 950.000 | 951.174 | 40.168 | 0.1487 | 0.3677 | 76.3294 | 149.66 | 3044.40 | 404.48 | 7.5267 |
| 4.6 | 4.68191 | 949.998 | 951.002 | 36.810 | 0.1455 | 0.3075 | 91.2860 | 178.45 | 3053.37 | 473.22 | 6.4524 |
| 4.7 | 4.64266 | 949.999 | 950.851 | 32.765 | 0.1424 | 0.2555 | 109.8510 | 214.52 | 3056.63 | 557.34 | 5.4843 |
| 4.8 | 4.59965 | 949.999 | 950.717 | 27.947 | 0.1394 | 0.2105 | 133.3600 | 260.71 | 3053.26 | 662.52 | 4.6086 |
| 4.9 | 4.55156 | 950.000 | 950.595 | 22.269 | 0.1366 | 0.1713 | 163.8690 | 321.56 | 3041.82 | 797.48 | 3.8143 |
| 5.0 | 4.49663 | 950.000 | 950.487 | 15.668 | 0.1339 | 0.1371 | 204.770 | 404.48 | 3021.93 | 976.62 | 3.0943 |
| 5.1 | 4.43244 | 950.000 | 950.388 | 8.135 | 0.1312 | 0.1072 | 261.7580 | 522.21 | 2991.96 | 1223.90 | 2.4446 |
| 5.2 | 4.35556 | 950.000 | 950.300 | −0.233 | 0.1287 | 0.0813 | 345.0530 | 697.81 | 2951.57 | 1582.33 | 1.8563 |
| 5.3 | 4.26112 | 950.000 | 950.223 | −9.170 | 0.1263 | 0.0592 | 474.0840 | 975.53 | 2900.78 | 2133.02 | 1.3600 |
| 5.4 | 4.14223 | 950.000 | 950.156 | −18.181 | 0.1239 | 0.0407 | 689.1240 | 1446.60 | 284.35 | 3043.12 | 0.9344 |
| 5.5 | 3.98978 | 950.000 | 950.101 | −26.520 | 0.1217 | 0.0260 | 1079.2200 | 2315.36 | 2782.28 | 4679.10 | 0.5946 |
| 5.6 | 3.79379 | 950.000 | 950.060 | −33.283 | 0.1195 | 0.0150 | 1866.8700 | 4090.55 | 2724.18 | 7949.53 | 0.3427 |
| 5.7 | 3.54947 | 950.000 | 950.031 | −37.644 | 0.1174 | 0.0076 | 3685.3900 | 8225.07 | 2674.52 | 15417.90 | 0.1735 |
| 5.8 | 3.26898 | 950.000 | 950.013 | −39.175 | 0.1154 | 0.0032 | 8734.9600 | 19739.50 | 2641.36 | 35912.80 | 0.0735 |

We claim:

1. A thin film, microwave frequency manifolded filter bank comprising:
   a semiconductor substrate having a plurality of holes disposed therein;
   a dielectric membrane positioned on said substrate and over the holes; and
   a plurality of resonators respectively disposed on a portion of said dielectric membrane over corresponding ones of the holes, each of said resonators comprising
   a first electrode disposed on said dielectric membrane;
   a piezoelectric film disposed on said first electrode; and
   a second electrode disposed on said piezoelectric film;
   a corresponding compensating inductor connected in parallel between the first and second electrodes of each said resonator;
   said plurality of resonators being arranged in a plurality of rows such that resonators in each row have said first and second electrodes electrically connected such that resonators of each row are in cascade, and such that adjacent rows of cascaded resonators are electrically connected in parallel such as to realize said manifold filter bank.

2. A thin film, microwave frequency manifolded filter bank according to claim 1, wherein said piezoelectric film comprises AlN.

3. A thin film, microwave frequency manifolded filter bank according to claim 2, wherein said piezoelectric film has a thickness that is in the range of about 2.0 μm to about 3.0 μm and said dielectric membrane has a thickness that is in the range of about 2.0 μm to about 7.8 μm.

4. A thin film, microwave frequency manifolded filter bank as in claim 1, wherein said compensating inductor has an inductance value of $1/(2\pi f_{center})^2 C_0$, where $f_{center}$ is the center frequency and $C_0$ is the parallel capacitance of the corresponding resonator.

5. A thin film, microwave frequency manifolded filter bank according to claim 1, wherein said piezoelectric film comprises ZnO.

* * * * *